(12) United States Patent
Rockrohr et al.

(10) Patent No.: US 6,521,903 B1
(45) Date of Patent: Feb. 18, 2003

(54) DEFLECTION NOISE REDUCTION IN CHARGED PARTICLE BEAM LITHOGRAPHY

(75) Inventors: James Rockrohr, Hopewell Junction, NY (US); David Stumbo, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/348,481

(22) Filed: Jul. 7, 1999

(51) Int. Cl.[7] ............................................ H01J 37/147
(52) U.S. Cl. ............................ 250/492.23; 250/396 R; 250/398; 250/356 ML; 250/397; 250/492.2
(58) Field of Search ............................ 250/492.23, 396, 250/396 R, 398, 356 ML, 396 ML, 397, 492.2

(56) References Cited

U.S. PATENT DOCUMENTS 5,635,719 A * 6/1997 Petric .......................... 250/396
6,133,987 A * 10/2000 Stumbo ........................ 355/67
6,180,947 B1 * 1/2001 Stickel et al. ............... 250/396

* cited by examiner

*Primary Examiner*—Bruce Anderson
*Assistant Examiner*—Zia R. Hashmi
(74) *Attorney, Agent, or Firm*—Whitham, Curtis & Christofferson, P.C.

(57) ABSTRACT

A common deflection signal is provided, simultaneously, to individual yokes in an electron beam (e-beam) deflection apparatus of an electron beam projection lithography system. A single digital-to-analog converter (DAC) generates the common deflection signal. The common deflection signal is provided to individual programmable attenuators to adjust the signal for each individual yoke. The adjusted individual signal is amplified and passed to one of the individual yokes. The yokes are controlled to provide a curvilinear variable axis lens (CVAL) deflection that is adjusted to attenuate most of the noise from the common deflection signal that would have been present in a typical CVAL e-beam system.

17 Claims, 5 Drawing Sheets

LITHOGRAPHY STEP

DEFLECTION NOISE REDUCTION IN CHARGED PARTICLE BEAM LITHOGRAPHY

BACKGROUND OF THE INVENTION

1. Field of the Invention

The present invention generally relates to charged particle beam lithography systems and, more particularly, to projection electron beam systems.

2. Description of the Prior Art

There is a continuing requirement to increase integration density of semiconductor integrated circuits to obtain maximum performance and functionality as well as maximum manufacturing economy. Accordingly, as practical limits of lithographic resolution using electromagnetic radiation (e.g. at deep ultra-violet (DUV and shorter wavelengths) for lithographic resist exposure has been approached, charged particle beams such as electron beams have been used to expose patterns on suitable resists even though such exposure tools require many sequential exposures to cover a chip area. To provide economically viable throughputs for charged particle beam exposure tools, projection systems have sought to shape the charged particle beam so that an increased number of pixels of the desired lithographic pattern can be exposed simultaneously and the number of sequential exposures correspondingly reduced.

Electron beam (e-beam) projection systems incur errors or noise in their deflection signals. These deflection signal errors result in placement errors in printed resist patterns (e.g. sub-field patterns) and, consequently, reduce product yield when projected sub-field images are not correctly stitched together. Some high throughput, state of the art electron beam lithography systems cover large fields corresponding to a large chip area while the feature size at the target/wafer is made smaller. For these state of the art e-beam systems, the electron beam deflection requirements are being driven to ever tighter specifications. However, noise makes these tighter deflection specifications increasingly difficult to achieve even with state of the art electronics.

For example, an electron beam projection system with a five millimeter (5 mm) deflection field and an error budget of five nanometers (5 nm) only allows an error of one part per million (1 ppm) for the entire deflection system. To produce a correct "curvilinear variable axis lens" (CVAL) deflection path, which is preferred for such a system, requires more than 40 electronic drivers, each driver introducing some generally minimal but finite amount of noise and error. The individual errors from the electronic drivers are cumulative and, at best, the errors are additive. Consequently, the cumulative deflection noise is, in large part, the source of e-beam deflection error. Therefore, typical state of the art hardware, digital to analog converters (DACs), drivers, etc., in a state of the art CVAL cannot achieve the error budget specification required for degrees of integration density otherwise possible.

Thus, there is a need for reduced cumulative noise in deflection arrangements of e-beam projection systems in order to realize the benefits of highest practical degrees of integration density with acceptable throughput and manufacturing yield.

SUMMARY OF THE INVENTION

It is therefore an object of the present invention to reduce cumulative noise in deflection arrangements of charged particle beam projection systems.

It is another object of the present invention to eliminate noise sources in e-beam projection systems and deflection arrangements therein, in particular.

It is yet another purpose of the invention to improve curvilinear variable axis lens image location accuracy.

The present invention is a charged particle beam lithography system and deflection drive arrangement therefor wherein a common deflection signal is provided, simultaneously, to individual yokes and yoke drivers in an electron beam (e-beam) deflection apparatus. A single digital-to-analog converter (DAC) generates the common deflection signal. The common deflection signal is provided to individual programmable attenuators to adjust the signal for each individual yoke such that each individual signal is proportional to the common deflection signal. The adjusted individual signal is amplified and passed to one of the individual yokes. The yokes are controlled to provide curvilinear variable axis lens (CVAL) deflection that is adjusted to attenuate most of the noise from that which would have been present in a typical CVAL e-beam system.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
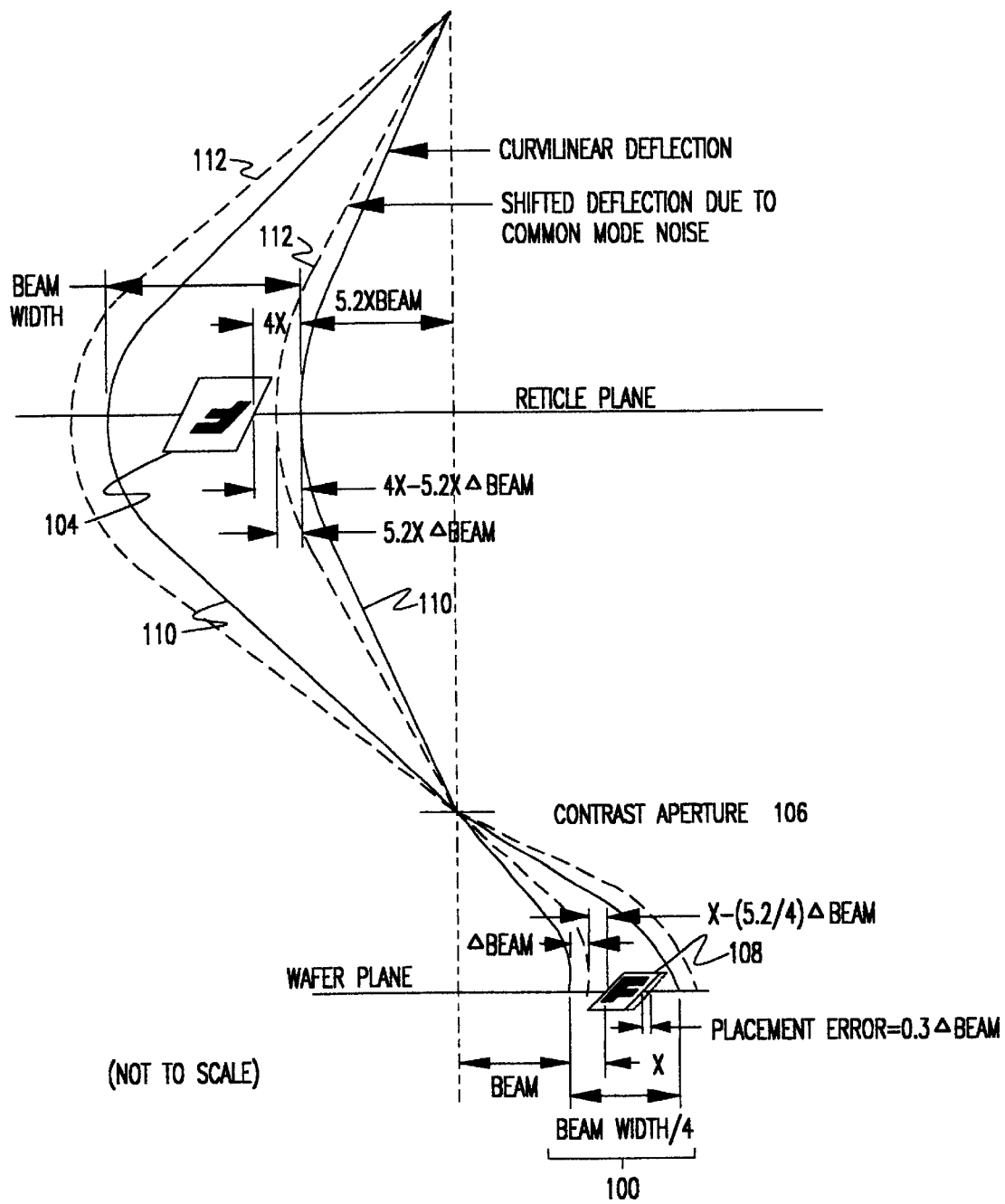
FIG. 1 shows a preferred embodiment curvilinear variable axis lens (CVAL) deflection.

Referring now to the drawings, and more particularly to FIG. 1, which shows a preferred embodiment curvilinear variable axis lens (CVAL) deflection, wherein the beam 100 is depicted as being first scanned over to the left by a series of deflection yokes to illuminate the reticle pattern 104. The resulting patterned electron beam is then scanned back to the right, as depicted, to pass through a contrast aperture 106 by another set of deflection yokes. Then, the patterned electron beam is scanned to the right by a final set of yokes, directing the electrons onto the resist coated wafer 108 at a desired location.

Although the invention will be described herein with respect to an electron beam deflected by magnetic deflection from yokes, it is contemplated that the present invention could be applied to any charged particle beam deflected by electrostatic deflection from deflection plates or electromagnetic deflection yokes or a combination thereof. Therefore, it is intended that the present invention be understood to extend to use of electrostatic deflection using deflection plates to deflect a charged particle beam. It should also be recognized that the term "deflection" is used to refer, generically, to both deflection of the beam and to the alteration of the axis of a lens to coincide with the beam which may be performed separately or in combination in various types of charged particle beam systems. A yoke or a group of yokes (or other deflection arrangements) are required for each direction of deflection at each stage and for shifting the axis of each of a plurality of lenses. Each such deflection arrangement is a potential source of noise and image location error as discussed above.

U.S. patent application Ser. No. 09/177,675, now U.S. Pat. No. 6,133,987 filed Oct. 22, 1998, entitled "TECHNIQUE FOR REDUCING PATTERN PLACEMENT ERROR IN PROJECTION ELECTRON-BEAM LITHOGRAPHY" (which is hereby fully incorporated by reference) by David P. Stumbo, a joint inventor of the present invention, discloses that when the gain or attenuation factor, $G_1$, of deflection drivers in the reticle stage, centered about the reticle plane, and the gain or attenuation factor, $G_2$, of deflection drivers in the target stage (below the contrast aperture and above the target plane) are arranged such that $G_1/G_2=M$, the demagnification factor of the lens system in which the deflection is performed, the overall deflection system is insensitive to the cumulative effects of noise common to the respective deflection yokes. Without wishing to be held to any particular theory underlying this effect, such insensitivity to noise appears to be due to the cancellation of noise (including quantization noise) in the deflection signal at the input of the respective drivers, substantially in a common mode rejection or cancellation manner.

However, in practice, several considerations prevent such conditions from being achieved and the potential advantages of such noise reduction from being realized. Specifically, reticles used in electron beam projection lithography are very delicate and susceptible to damage as well as being extremely expensive to produce. To provide a more robust structure that is less susceptible to damage, it is customary to form reticles with areas of thin membrane (patterned by apertures or deposits of strongly scattering materials), which correspond to respective sub-fields of the overall chip design pattern, separated by a network of thicker struts of an arbitrary width (generally chosen, at the present time, to be about 0.3 mm), referred to as grillage. The deflection is performed such that the grillage does not appear in the composite exposure pattern at the target. Therefore the pitch of sub-fields on the reticle does not correspond to the pitch of the sub-field image at the target multiplied by M. Accordingly, the use of grillage in the reticle is inherently incompatible with obtaining the conditions noted in the above-incorporated application.

Additionally, the location of the sub-field patterns on the reticle may contain small errors and correction is necessary to center the beam in the sub-field and then return the beam to the optical axis of the tool. To accommodate possible sub-field location errors on the reticle and to avoid imaging the grillage at the target consistent with cancellation of cumulative noise, the above-incorporated application seeks to provide an overall deflection system that observes the above conditions and then to superimpose correction calibrated to the reticle at a resolution which does not degrade the location accuracy of the uncorrected but noise-reduced system.

Further, another problem addressed in the above-incorporated application is that of a response speed and resolution trade-off in Digital to Analog converters (DACs) that are available at the present state of the art. In essence, state of the art DACs which provide a number of bits of resolution sufficient to accommodate the required location error budget also exhibit a response time that severely compromises throughput. Conversely, state of the art DACs which can respond within acceptable response time to support acceptable throughput do not provide sufficient analog signal resolution to support the required location accuracy.

The above-incorporated application proposes a solution which, as alluded to above, provides a correction for each sub-field location on the reticle and, further, derives the corrections in a manner which lumps residual error from a lower resolution "main deflection DAC" (which may thus be considered as a coarse deflection) with the sub-field correction (and grillage) so that the additional correction functions as a fine deflection. However, the magnitude of the fine correction for any particular sub-field can be comparable to or exceed the resolution of the coarse deflection (especially to accommodate displacement of multiples of the grillage width) or be relatively small. When it is considered that the fine or sub-field correction represents a variance from the conditions upon which the noise cancellation is based in accordance with the invention in the above-incorporated application, it can be seen that the amount of noise cancellation (or, conversely, residual common noise) will vary unpredictably from sub-field to sub-field and, unless the fine deflection/correction is limited to the resolution of the coarse deflection, does not guarantee that the sub-field images will be properly be stitched together at the target, as is essential to acceptable manufacturing yield. In any event, such an approach will yield non-uniform and unpredictable variation in image location errors (e.g. beyond the random nature of the noise) across the plurality of sub-fields which form the desired integrated circuit pattern.

Figure 2:
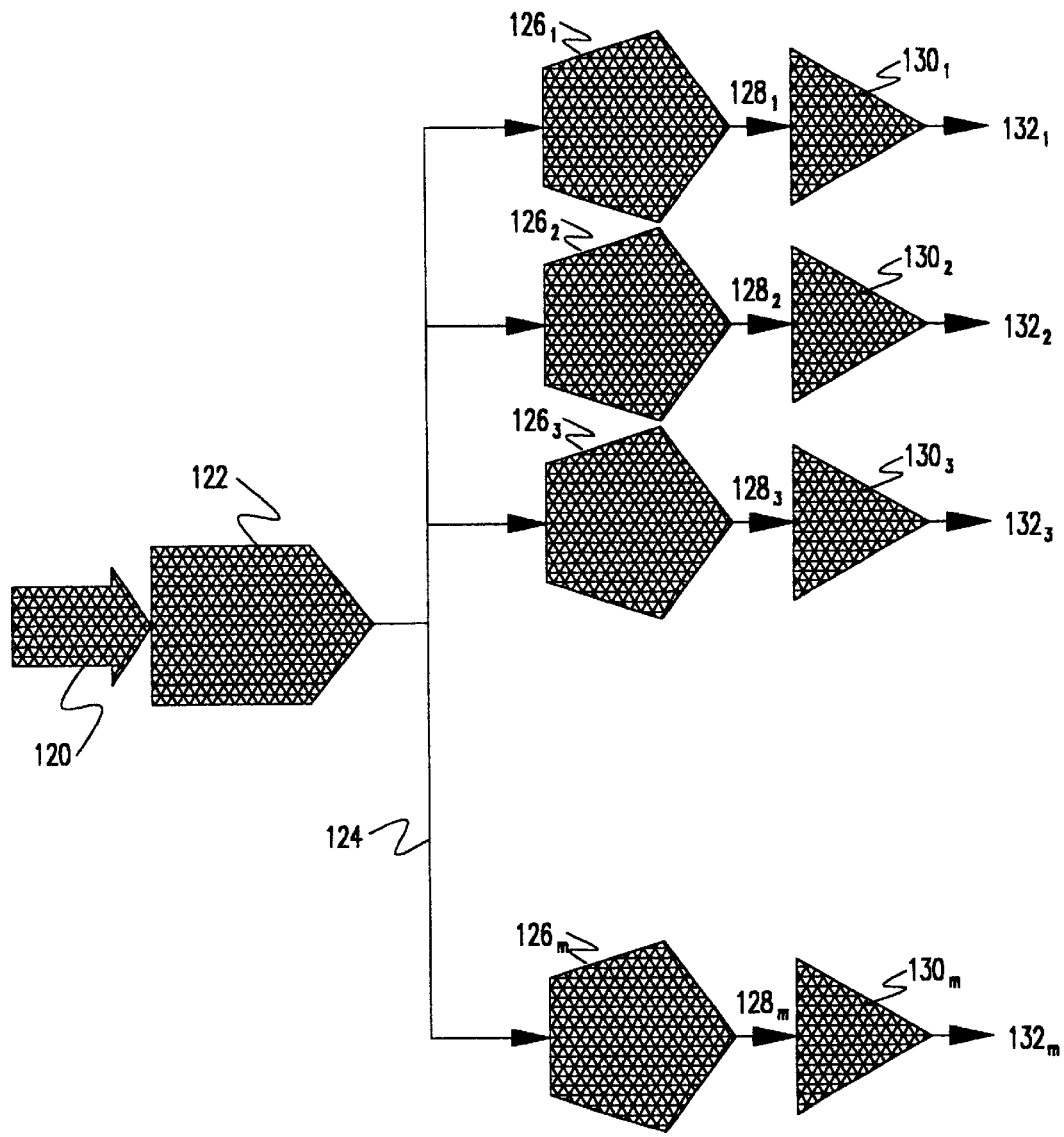
FIG. 2 is a drive circuit for the preferred embodiment CVAL deflection apparatus.

FIG. 2 is a drive circuit for the preferred embodiment CVAL deflection apparatus in accordance with the preferred embodiment of the invention, wherein a common deflection signal is provided, simultaneously, to individual yoke drive circuits and then, to individual yokes. Digital deflection data 120 from a controller, e.g., a computer, is provided to a digital-to-analog converter (DAC) 122. This DAC 122 is a single common source generating common deflection signal 124. The common deflection signal 124 is passed to individual programmable attenuators $126_1$–$126_n$, one each for each of n yokes to be controlled. Preferably, the programmable attenuators $126_1$–$126_n$ are Multiplying DACs (MDACs) to scale the signal to an appropriate level. The scaled individual signals $128_1$–$128_n$ are each provided to one corresponding power amplifier $130_1$–$130_n$ capable of driving a respective yoke. Each amplified yoke control signal $132_1$–$132_n$ is passed to a respective yoke of a preferred CVAL. Thus, the resulting CVAL provides a properly adjusted deflection as in FIG. 1 and which can accommodate the width of grillage in the reticle.

The inventors have now discovered that the above-noted criterion disclosed in the above-incorporated application is a special case for full cancellation of deflection noise which is common to all yokes or other deflection arrangements. Much of the noise in this common deflection signal from the preferred embodiment CVAL has been eliminated in accordance with a meritorious effect of the present invention since all of the deflection signals for the respective deflection arrangements are proportional to a common deflection signal even though the $G_1/G_2=M$ condition is not maintained if grillage is present in the reticle.

More specifically, the inventors have discovered that if all deflection signals are maintained proportional to the actual calibrated deflection for each sub-field of the reticle and location in the target plane, an unexpected degree of cancellation of noise common to all yokes or other deflection arrangements will be maintained. Moreover, the location error is a substantially uniform fraction of the noise over the chip pattern and hence predictable and controllable to a degree that can maintain the error within limits to accommodate a specified error budget. In this regard, the cumulative noise location error can be limited to allow noise margins sufficient to accommodate noise appearing in individual yokes and drivers within the noise budget and/or allow use of DACs of relatively lower resolution and relatively faster response.

Figure 3:
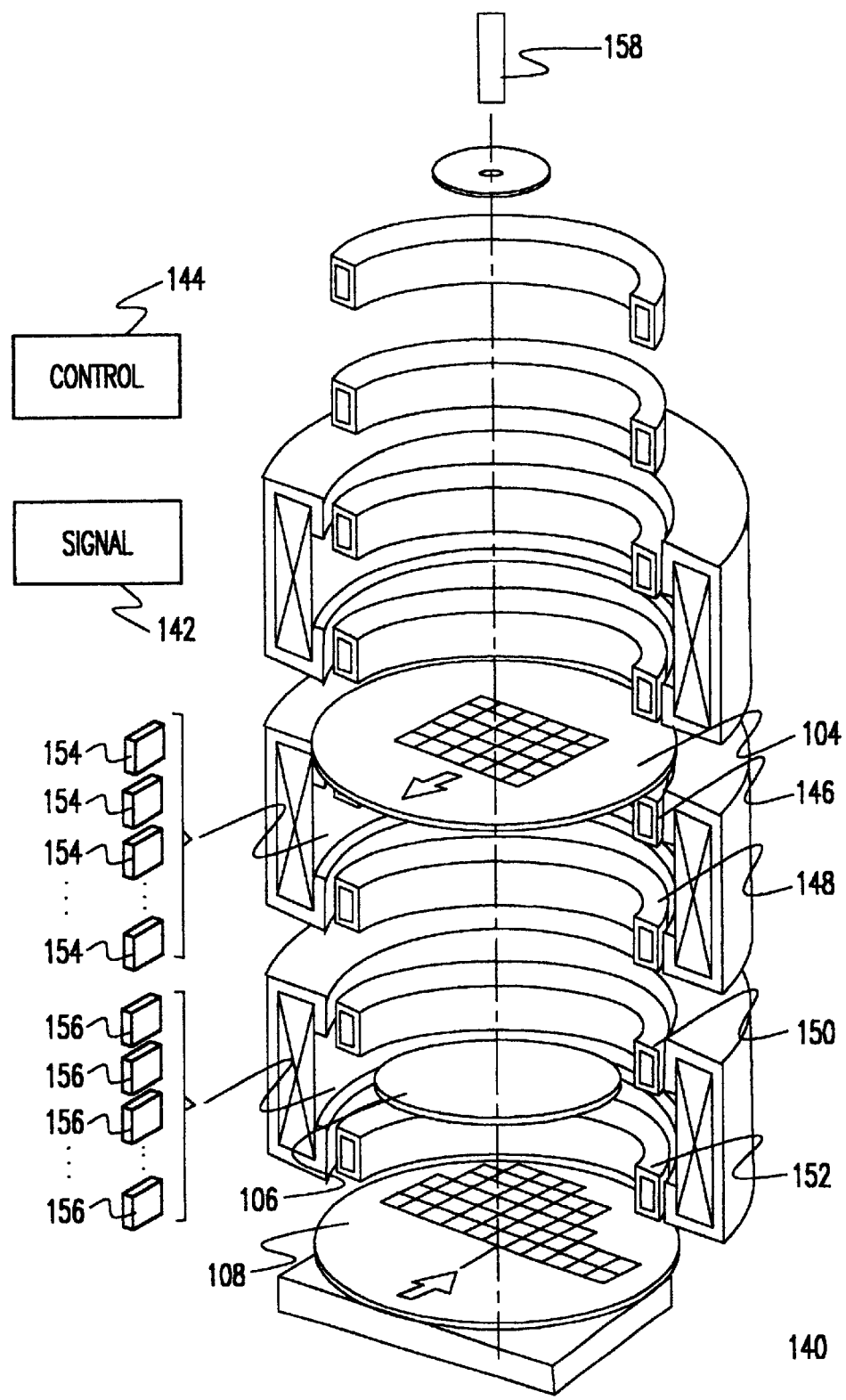
FIG. 3 is a lens arrangement for the preferred embodiment CVAL deflection apparatus.

FIG. 3 shows the preferred embodiment CVAL 140. This preferred embodiment CVAL is similar to that taught In U.S. Pat. No. 5,635,719 entitled "Variable Curvilinear Axes Deflection Means for Particle Optical Lenses" to Petric, which is fully incorporated herein by reference. The preferred embodiment of the present invention principally differs from that of this incorporated patent in that the drive circuit of FIG. 2 has been incorporated in signal block 142. Control 144 from a controller, such as a computer, is passed to the preferred embodiment driver circuit of FIG. 2 in signal block 142. The amplified yoke control signals $132_1$–$132_n$ are passed from signal block 142 to deflectors 146, 148, 150 and 152, as well as axis compensation yokes 154 and 156. A beam originating from source 158 travels along the path of FIG. 1 until it strikes resist on its target at wafer 108.

Thus, referring again to the beam of FIG. 1 with reference to the lens 140 of FIG. 3, the solid beam outline 110 of FIG. 1 represents the electron beam's "nominal" path originating from e-beam source 158, illuminating the reticle 104 sub-field. The beam passes through the contrast aperture 106 finally illuminating the wafer surface. The dashed outline 112 represents an error in the electron beam caused by noise at or prior to DAC 122, slightly shifting the beam path. The shift is sometimes referred to as delta beam (sometimes using the Greek symbol for delta for convenience). The common deflection signal generated by the circuit of FIG. 2 is such that all deflection yokes 146, 148, 150, 152, 154 and 156 are provided with a dramatically reduced proportional error. Placement error is a function of the difference between the deflection, demagnification ratio and the image deflection ratio (e.g. the ratio of the center-to-center spacing of sub-fields as formed on the reticle to the sub-field center-to-center spacing at the target, such as 1.3 mm:0.25 mm=5.2, assuming a 0.3 mm grillage width, a 1 mm reticle sub-field dimension and a 0.25 mm sub-field image dimension at the target/wafer plane). Thus, the placement error equations from this shift may be derived from the diagram of FIG. 1 as follows:

If the image placement at the wafer is defined as the beam edge location (beam)+X, after demagnification (e.g. of 4:1) the placement of the beam at the reticle is correspondingly defined as 5.2×beam+4X. If a placement error at the target/wafer plane is defined as delta beam, then the beam placement error referred to the reticle is the deflection ratio (e.g. 5.2)×delta beam. Thus the actual placement of the beam at the reticle including the placement error is expressed as (assuming the deflection ratio is 5.2:1) 5.2(beam+delta beam)+4X−5.2×(delta beam). It should be noted that this beam placement at the reticle is the same as the originally defined placement at the reticle since the reticle sub-field 104 remains in the same location (5.2×beam+4X) although the beam illuminating it may have moved.

Now, referring the placement location back to the wafer by applying proportionality of the original definitions of the placement locations at the target and reticle planes yields a placement location at the target/wafer plane which may be expressed as $$= \frac{5.2(\text{beam} + \text{delta beam})}{5.2} + \frac{4X - 5.2(\text{delta beam})}{4}$$

=beam+delta beam+X−(5.2/4) delta beam

=beam+X−delta beam ((5.2/4)−1).

Subtracting the beam placement as originally defined from the placement location including the error, the placement error is defined as:

=Original Edge Position−Shifted edge Position

Therefore, the placement error attenuation is:

$$= \frac{(\text{Defl. Ratio} - \text{Image Demag})}{\text{Image Demag}}$$

Thus, for example, in the preferred embodiment system the reticle image is a 1 mm square sub-field. A typical reticle may be a thin (about 2 micrometer thick) membrane over a window-like grid. These grid windows are separated by a thick (e.g., about 300–600 micrometer) silicon ridge or strut forming grillage as alluded to above. Each sub-field is demagnified by appropriate lenses, producing a 0.25 mm square image on the target wafer, i.e., a demagnification factor of 4:1. In this example, these sub-field images are spaced apart on 1.3 mm centers on the reticle, i.e., by the 0.3 mm wide sub-field ridge. This spacing ridge allows 0.3 mm between each sub-field for structural support. To insure correct stitching, these sub-fields must be placed on the wafer to remove the 0.3 mm overlap/gap. Consequently, for this example, the deflection ratio must be 5.2:1 (1.3 mm to 0.25 mm) as alluded to above.

Since as noted above, placement error is a function of the difference between the deflection ratio (in this example 5.2) and the image demagnification ratio (in this example 4), the result is that, for this example, ((5.2/4)−1) 0.3 or only 30% of the common mode signal error propagates to the final image printed on the wafer. Recalling that delta beam was the placement error due to noise, the attenuation of the placement error is 70%, maintained through the use of the invention even though the width of reticle grillage is roughly one-third of the transverse dimension of a sub-field.

For the preferred embodiment of the Invention, for this example, the resulting 30% placement error shift in the final image is attenuated by a factor of 3.33 over the prior art. Ultimately, as the deflection ratio approaches the demagnification ratio (as the proportional width of grillage is reduced relative to sub-field dimensions), this error decreases, theoretically, towards zero, i.e., when the two ratios match (when grillage is omitted). Furthermore, this improvement is realized without affecting image placement from the common deflection signal.

Thus, the preferred embodiment CVAL of the present Invention attenuates the errors of the common deflection signal, which could otherwise be large; dominating the overall error budget. Remaining deflection errors are attributable to noise In the individual yoke drivers, which affect image placement to varying but substantially lesser degrees and which are dependent upon deflection yoke 146, 148, 150, 152, 154 and 156 placement along the beam path.

Figure 4A:
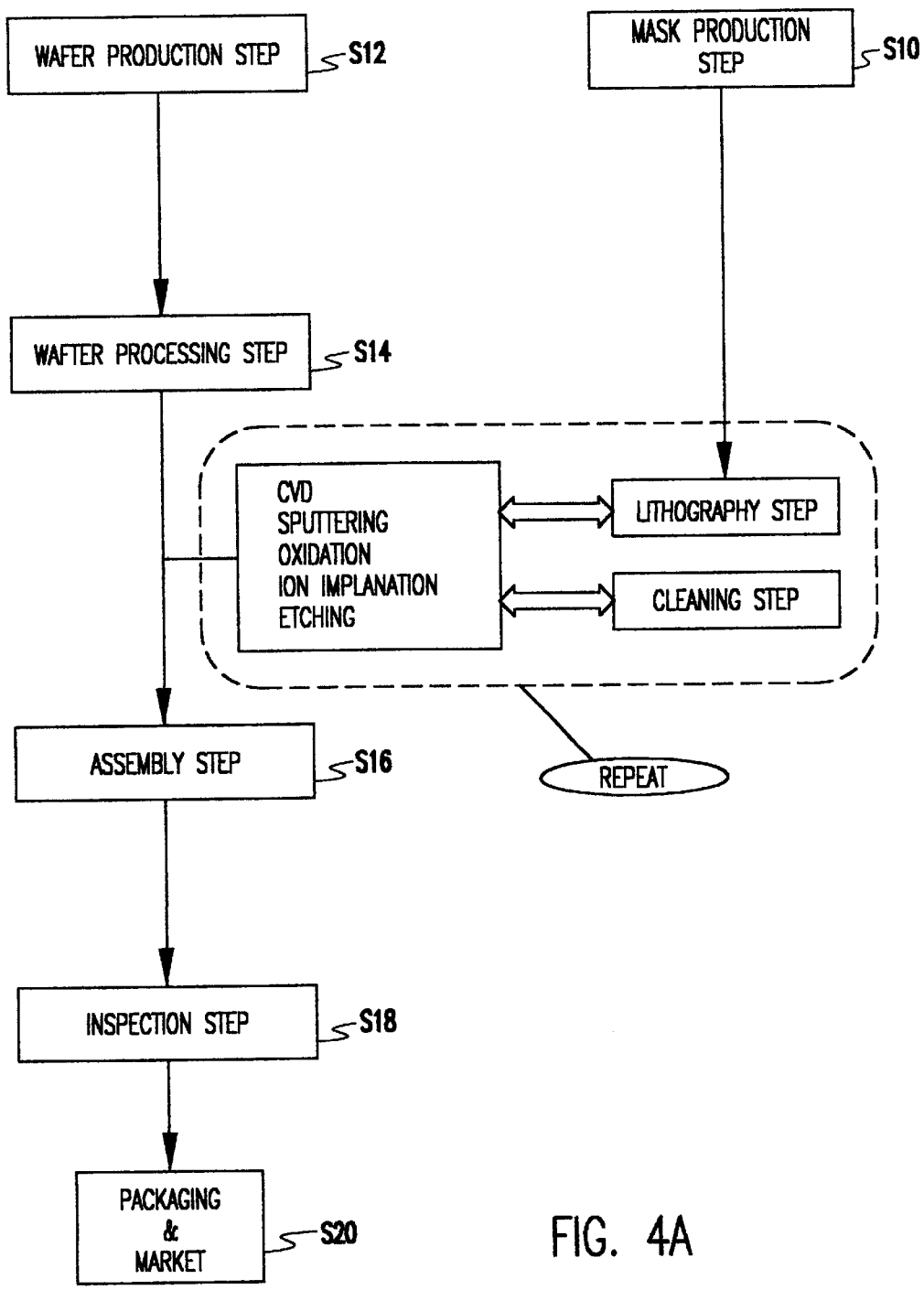
FIGS. 4A and 4B depict operation of an e-beam lithography system including the invention to manufacture semiconductor integrated circuits of high quality and with high throughput and improved manufacturing yield.

FIG. 4A shows a generalized flow diagram providing an overview of the fabrication process for a semiconductor device (or apparatus) utilizing the invention. It is well understood by one of ordinary skill in the art that FIG. 4A may equally represent a high level block diagram of a fabrication process of a semiconductor device. It is also well understood that the high level block diagram represents a preferred although generalized fabrication method and that other fabrication methods may be equally used with the present invention. Details of particular fabrication methods are unimportant to the practice of the invention; however, at least one lithographic exposure is invariably required to determine device locations and dimensions. When the lithographic process is carried out utilizing the invention described above, more accurately defined patterns comprising a plurality of sub-field images properly stitched together can be achieved consistent with high throughput in manufacture of integrated circuits of increased functionality and improved performance and which are not otherwise reliably producible with other currently known lithographic techniques that do not include utilization of the invention.

Referring now to FIG. 4A, the semiconductor device fabrication begins with a mask fabrication at step S10. The mask fabrication comprises patterning a mask or reticle by known methods such as, for example, resist coating, electron beam exposure, development, etching, resist stripping and the like. Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification to the thin film is performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the intended use and design of the finished device.

The thin film is patterned using the mask fabricated in step S10. The patterning of the thin film includes exposing the resist layer coated thereon, via a lithographic process (e.g., charged particle exposure), to form a latent image on the resist. The charged particle exposure is discussed in detail with reference to FIG. 4B. It is further well understood that the charged particle exposure selectively modifies the resist in a predetermined pattern by altering the chemical composition of the resist. The resist is then developed to form a pattern in accordance with the exposure and inspected for any defects. The wafer is baked to stabilize the resist pattern before or after inspection, and after the desired processing (e.g., etching, deposition, implantation and the like), the resist may be stripped and the wafer washed, if necessary.

The charged particle exposure associated with step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact hole (e.g., through hole).

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 4B:
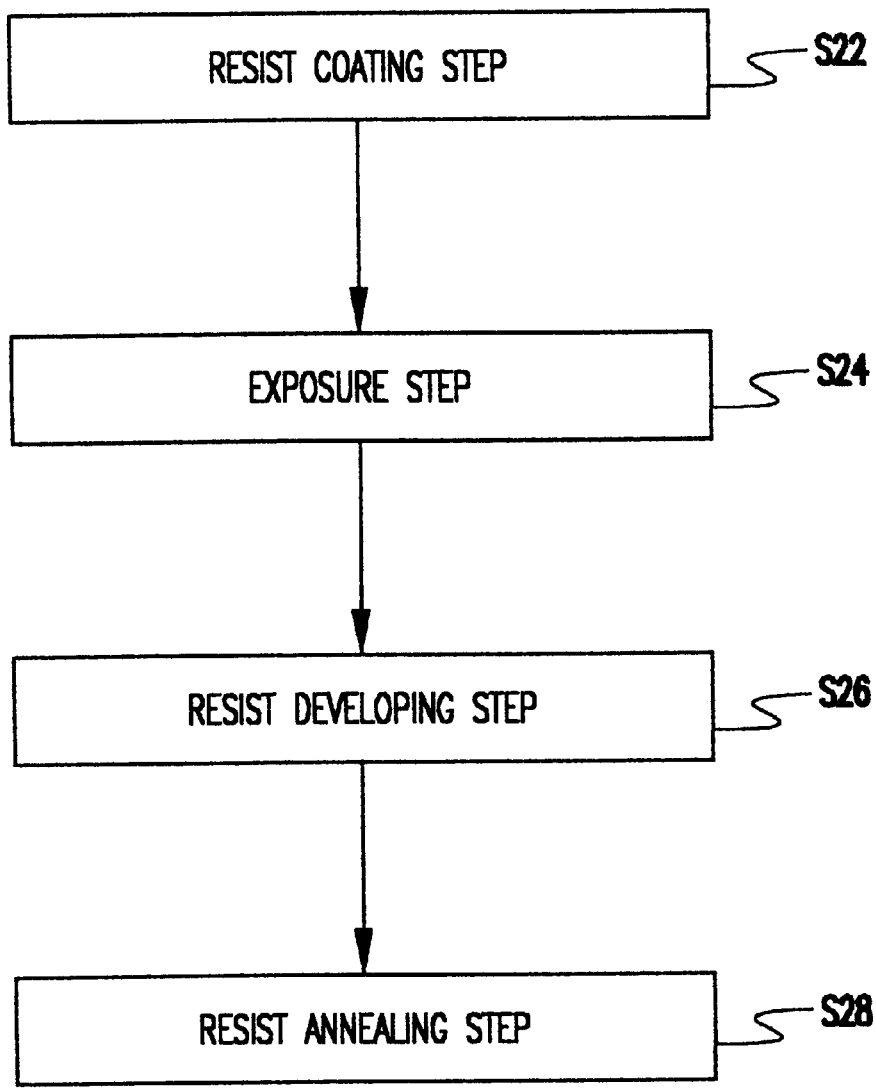

FIG. 4B shows the detailed process of resist pattern formation as shown with relation to the resist pattern formation of step S14 of FIG. 4A. As is well understood by those skilled in the art, the lithographic process of steps S22–S26 is invariably included to define latent images on the resist, and that the patterning of the resist is critical to the overall design of the device regardless of the technology that may be used to develop such latent images on the resist since the location and basic dimensions of electron elements and conductors are established thereby. To this end, at step S22, the step of resist coating is shown. At step S24, the resist is exposed to an electron beam pattern utilizing the mask formed in step S10 of FIG. 4A. This exposure is performed, for example, by an electron beam stepper device. As described above, the invention greatly reduces sub-field exposure location error and allows the sub-fields to be stitched together with increased accuracy and, hence, increased manufacturing yield. Manufacturing yield is particularly enhanced since utilization on the invention for lithographic exposures results in relatively uniform and controllable levels or degrees of sub-field exposure location error allows reliable accommodation of noise levels in individual deflection arrangements by enabling error margins to be maintained within extremely tight specifications.

At step S26, the resist is developed to form a pattern in accordance with the exposure of step S24. At step S26, the resist in then annealed. Once such a pattern is formed, the semiconductor fabrication process continues as described above. In particular, increased accuracy of structures extending across sub-field boundaries achieved by the invention tends to reduce resistance of conductors and maintain the signal propagation time of the completed integrated circuit device, as designed while reducing tendencies toward deleterious effects such as metal migration which may occur after an operative device is placed in service.

In view of the foregoing, it is seen that the invention provides substantial reduction of deflection noise in a deflection signal common to a plurality of deflection arrangements such as magnetic yokes while accommodating grillage in a reticle or other beam shaping arrangements and requiring a deflection ratio other than the magnification or demagnification factor or ratio. The placement error of the beam may be held to a low fraction of the common noise with substantial uniformity for all sub-fields of the exposure field and thus allows maintenance of total noise (including noise in individual deflection arrangements) within a stringent noise budget.

While the invention has been described In terms of preferred embodiments, those skilled in the art will recognize that the invention can be practiced with modification withIn the spirit and scope of the appended claims.

Having thus described my invention, what I claim as new and desire to secure by Letters Patent is as follows:

1. A drive circuit for a charged particle beam lithographic exposure tool including a plurality of yokes, said drive circuit comprising:

a digital to analog converter (DAC) receiving digital deflection data and generating therefrom a common deflection signal;

a programmable attenuator for each of said plurality of yokes receiving said common deflection signal and generating therefrom a scaled individual signal proportional to said deflection data; and a power amplifier for each of said plurality of yokes receiving a corresponding scaled individual signal from a corresponding said programmable attenuator and generating a yoke control signal therefrom whereby a plurality of deflection control signals are made proportional to said common deflection signal other than such that $G_1/G_2=M$ where G1 and G2 are gain or attenuation factors of deflection drivers in the reticle and target stages, respectively, and M is the demaginification factor of the lens system.

2. The drive circuit of claim 1 wherein each said programmable attenuator is a multiplying DAC.

3. The drive circuit of claim 1 wherein said charged particle beam lithographic exposure tool includes a curvilinear variable axis lens (CVAL).

4. A particle beam lithography system including a curvilinear variable axis lens (CVAL), said CVAL comprising:

a plurality of deflection yokes;

means for generating a common deflection signal; and means for simultaneously providing said generated common deflection signal to said plurality of deflection yokes as deflection control signals whereby a plurality of deflection control signals are made proportional to said common deflection signal other than such that $G_1/G_2=M$.

5. The particle beam lithography system of claim 4 wherein said means for generating is a DAC.

6. The particle beam lithography system of claim 5 wherein said means for simultaneously providing comprises:

a programmable attenuator for each of said plurality of yokes receiving said common deflection signal and generating therefrom a scaled individual signal; and a power amplifier for each of said plurality of yokes receiving a corresponding scaled individual signal from a corresponding said programmable attenuator and generating a yoke control signal therefrom.

7. The particle beam lithography system of claim 6 wherein each said programmable attenuator is a multiplying DAC.

8. The particle beam lithography system of claim 7 further comprising control means for providing control Information to said DAC.

9. The particle beam lithography system of claim 4 wherein said particle beam is an electron beam.

10. A particle beam lithography system including a curvilinear variable axis lens (CVAL), said CVAL comprising:

means for generating a particle beam;

control means for providing digital deflection data;

a digital to analog converter (DAC) receiving said digital deflection data and generating therefrom a common deflection signal;

a plurality programmable attenuators receiving said common deflection signal and generating therefrom a scaled individual signal; and a power amplifier for each of said plurality of programmable attenuator receiving a corresponding scaled individual signal from a corresponding on of said plurality of programmable attenuators and generating a deflection control signal therefrom whereby a plurality of deflection control signals are made proportional to said common deflection signal other than such that $G_1/G_2=M$; and means for controlling said particle beam's path of travel responsive to each said deflection control signal, each said deflection control signal controlling said particle beam's path of travel at a different point along said particle beam's path of travel.

11. The particle beam lithography system of claim 10 wherein said means for controlling said particle beam's path of travel comprises:

a plurality of deflection yokes, each receiving one said deflection control signal from a corresponding one of said power amplifier, said plurality of deflection yokes controlling said particle beam's path of travel.

12. The particle beam lithography system of claim 11 wherein each said programmable attenuator is a multiplying DAC.

13. The particle beam lithography system of claim 12 wherein said particle beam is an electron beam.

14. A method of manufacturing an integrated circuit using a charged particle beam lithographic exposure tool having a plurality of deflection means, said method including steps of providing a deflection signal corresponding to a desired exposure location at a target plane of said exposure tool, applying a signal to each of said deflection means which is proportional to said deflection signal such that a charged particle beam is directed to a desired position on a reticle and to said target plane whereby noise in said deflection signal is reduced, exposing a resist on a wafer at said target plane, and processing said resist and said wafer to complete said integrated circuit.

15. The method of claim 14, wherein said plurality of deflection means and said applying step provide a curvilinear variable axis lens.

16. The method of claim 14, wherein said charged particle beam is an electron beam.

17. The method of claim 15, wherein said charged particle beam is an electron beam.

* * * * *